US008190950B2

United States Patent
Chen et al.

(10) Patent No.: US 8,190,950 B2
(45) Date of Patent: May 29, 2012

(54) DYNAMIC COLUMN REDUNDANCY REPLACEMENT

(75) Inventors: Alan Chen, Saratoga, CA (US); Neville Ichhaporia, San Jose, CA (US); Ivan N. Kutzarov, Scotland (GB); Graham H. M. Stout, Glasgow (GB)

(73) Assignee: Atmel Corporation, San Jose, CA (US)

( * ) Notice: Subject to any disclaimer, the term of this patent is extended or adjusted under 35 U.S.C. 154(b) by 469 days.

(21) Appl. No.: 11/963,245

(22) Filed: Dec. 21, 2007

(65) Prior Publication Data

US 2009/0161429 A1    Jun. 25, 2009

(51) Int. Cl.
G11C 29/24 (2006.01)
G11C 29/54 (2006.01)
(52) U.S. Cl. .......................... 714/711; 714/718
(58) Field of Classification Search .................. None
See application file for complete search history.

(56) References Cited

U.S. PATENT DOCUMENTS

| 5,005,158 | A * | 4/1991 | McClure et al. ............... 365/200 |
| 5,517,660 | A * | 5/1996 | Rosich .......................... 711/117 |
| 5,555,522 | A * | 9/1996 | Anami et al. .................. 365/200 |
| 5,787,046 | A * | 7/1998 | Furuyama et al. ........ 365/230.03 |
| 6,865,125 | B2 * | 3/2005 | Tanzawa et al. ............... 365/200 |
| 6,914,846 | B2 | 7/2005 | Harari et al. |
| 7,158,425 | B2 | 1/2007 | Chen et al. |
| 2001/0030896 | A1 * | 10/2001 | Ooishi ........................... 365/200 |
| 2007/0014172 | A1 | 1/2007 | Hidaka |
| 2008/0141067 | A1 * | 6/2008 | Nautiyal ........................... 714/6 |

* cited by examiner

*Primary Examiner* — Cynthia Britt
*Assistant Examiner* — Dipakkumar Gandhi
(74) *Attorney, Agent, or Firm* — Fish & Richardson P.C.

(57) ABSTRACT

A dynamic column redundancy replacement system for programming and reading a non-volatile memory system includes an input data replacement logic block and an output data replacement logic block. A column redundancy match logic block compares a user address to latched fuse addresses of bad columns and identifies address matches to facilitate the replacement of bits from defective memory cells with replacement redundancy bits.

25 Claims, 5 Drawing Sheets

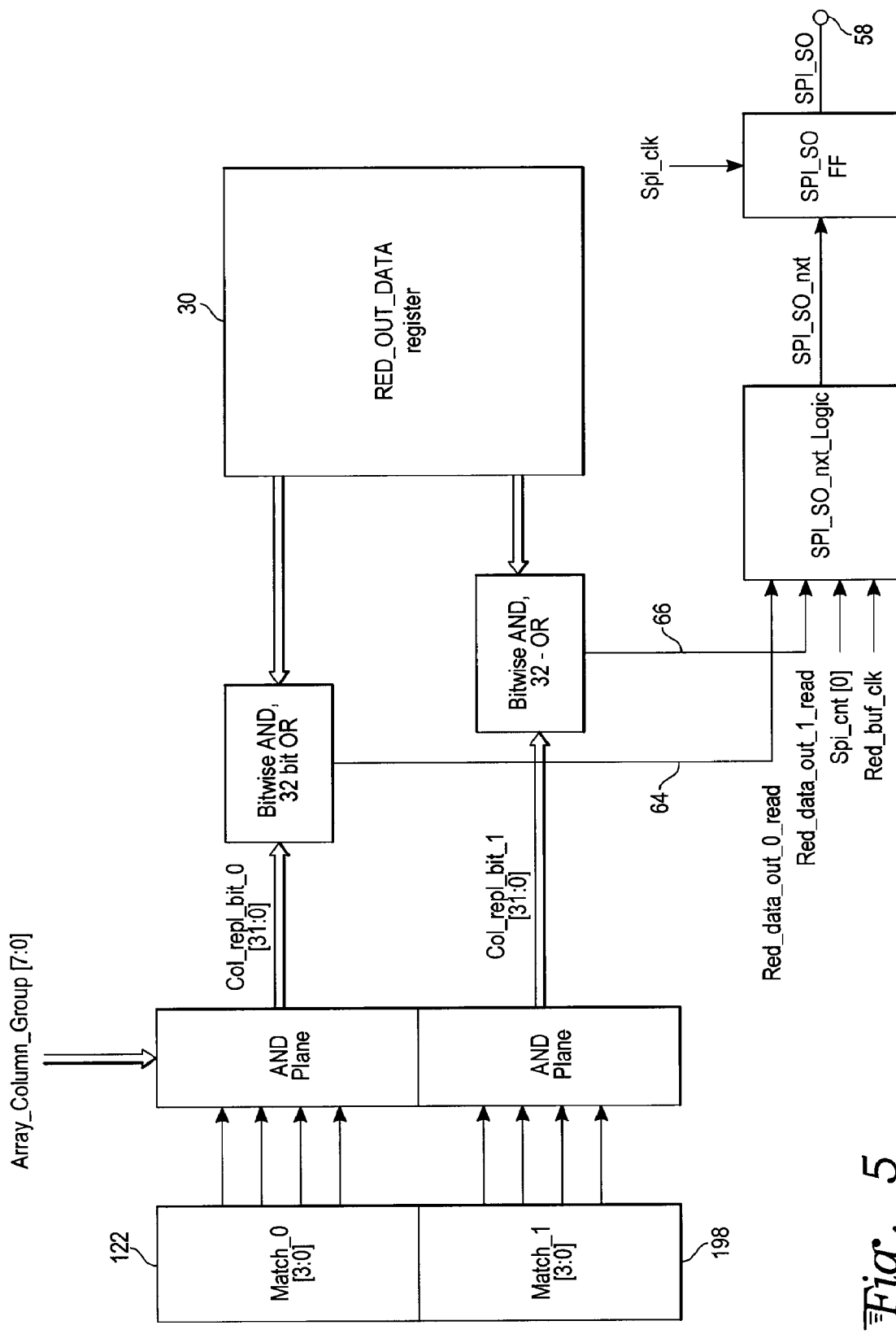
Fig._5

DYNAMIC COLUMN REDUNDANCY REPLACEMENT

TECHNICAL FIELD

This invention relates to redundancy for non-volatile memories.

BACKGROUND

Traditional column redundancy schemes for a non-volatile memory provide the non-volatile memory chip with a page-buffer (SRAM) and a multiplexer. In the first scheme, a page-buffer holds data while column redundancy is being processed. In the second scheme, control logic multiplexes data from a redundancy bitline when a column counter addresses a bitline with defective memory cells. Both of these column redundancy schemes require significant chip area and processing time, especially when the implementations use high voltage devices or are located close to the memory core.

A problem with present serial high-density FLASH memory controller logic chips is under-utilization of the controller logic chip functions when serial data is clocked into or out of the FLASH memory chip. During these times, while a user has control of the system clock and data, not much is happening concurrently in the controller logic chip aside from the opening of data paths to allow data to flow to or from a user. Replacement of redundant data, if not done during this data-clocking period, would have to be done before the next data-clocking period. The resulting increases in latency and chip area needed for the required specialized redundancy logic become more problematic as demand grows for faster serial memories with higher densities.

SUMMARY OF THE INVENTION

One embodiment of a dynamic column redundancy replacement system for programming and reading a non-volatile memory system includes an input data replacement logic block and an output data replacement logic block. A column redundancy match logic block identifies a user address as that of a defective non-volatile memory cell by comparing the address to latched addresses of bad columns. For a program mode of operation, a multi-bit data program redundancy register stores actual redundant input data information and a FIFO register masks internal operations of the memory controller logic while the user is serially sending data. For a read mode of operation, a multi-bit data read redundancy register stores actual redundant output information such that dynamic output data replacement can take place based on the match of a user column address with that of a defective memory cell.

A method embodiment dynamically replaces column redundancy data while programming and reading a non-volatile memory system includes: masking and modifying data in an input data replacement logic blocks; replacing memory data from a defective memory cell with correct redundancy data; and comparing a user address to latched addresses of bad columns in a column redundancy match logic block.

Other embodiments are also disclosed.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a block diagram of a portion of FIG. 1 and FIG. 2.

DETAILED DESCRIPTION

Embodiments of the present redundancy scheme preclude the necessity of a page buffer that typically can occupy a large area in a chip design. Those embodiments provide for processing of data on-the-fly without the need for the data to be stored statically prior to processing. A companion chip provides the column redundancy architecture and operational sequences for operating a flash memory. Embodiments of the invention use the latency time between user serial input or output operations (a bit-wise operation) and the communication operation between a memory controller logic and an actual memory (a byte-wise operation) to perform a column redundancy replacement operation. In other words, the column redundancy scheme facilitates concurrent column redundancy replacement and system user operations on memory data.

Figure 1:
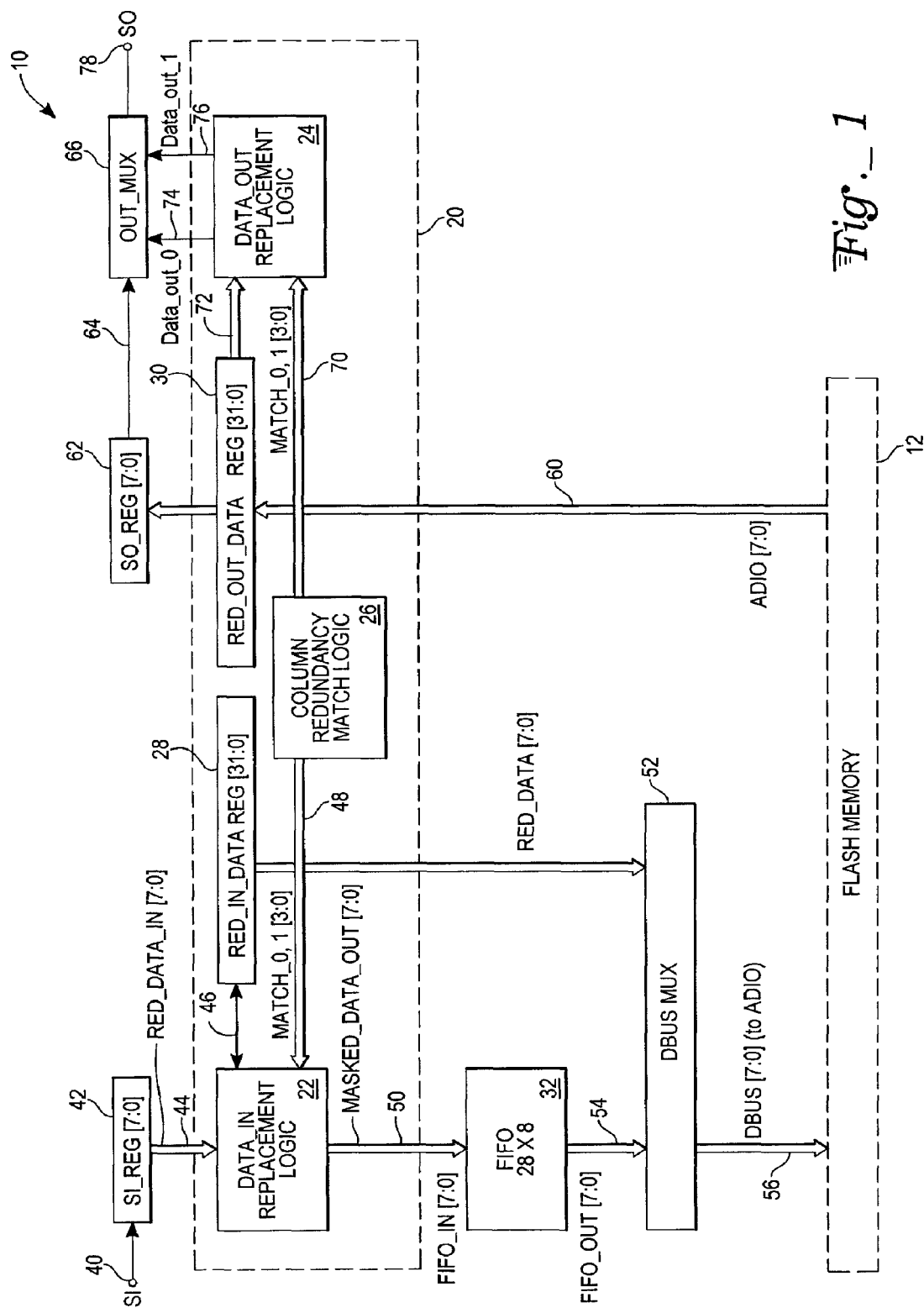
FIG. 1 is a block diagram of an embodiment of a column redundancy system.

FIG. 1 provides an overview of an exemplary embodiment of a column redundancy system 10 that implements a concurrent column redundancy data replacement scheme that operates while a system user is either fetching data from a serial FLASH memory chip 12 in a read mode of operation or the system user is sending data to the serial FLASH memory chip 12 in a program mode of operation. Note that the number of bits, columns, etc., in this description of this embodiment are for exemplary purposes only and may vary in different embodiments. A serial FLASH memory has a serial interface that sends and receives data bits one at a time. In order to facilitate column redundancy replacement, the redundancy system 10 utilizes the latency created between a bit-wise serial data input or output operation of the user and byte-wise communication between FLASH memory controller logic 20 and the actual FLASH memory 12.

The memory controller logic 20 is comprises various logic blocks that work together. A data_in replacement logic block 22 is a redundancy input data processing unit through which user serial input data is masked, modified if necessary, and sent to the FLASH memory 12. A data_out replacement logic block 24 is a redundancy output data processing unit in which memory data from a defective memory cell is replaced with correct redundancy data and then serially sent to the user. A column redundancy match logic block 26 provides comparison logic that compares a user address against latched fuse addresses of bad columns. The column redundancy match logic block 26 provides the resulting address match information to the data_in replacement logic block 22 and to the data_out replacement logic block 24 to facilitate the replacement of bits from defective memory cells with corresponding redundancy bits. For program and erase modes of operation, actual redundant input data information is stored in a 32-bit redundancy data register RED_IN_DATA REG [31:0] 28 with associated logic. For a read mode of operation, actual redundant output information is stored in a 32-bit redundancy data register RED_OUT_DATA REG [31:0] 30 with associated logic. A 28-byte first-in-first-out FIFO register 32 is also provided to mask the internal operations of the memory controller logic 20 while a user is serially sending/receiving data.

Program Operation:

For a program mode of operation, serial input data to be programmed into the FLASH memory 12 are provided by a user at serial input SI terminal 40 of an 8-bit serial input register SI_REG [7:0] 42. Parallel data RED_DATA_IN [7:0] from the 8-bit serial input register 42 are coupled through a bus 44 to input terminals of the data_in replacement logic block 22. Redundant data is coupled through a signal line 46 to the 32-bit redundancy data register 28. The column redundancy match logic block 26 provides two groups of match signals MATCH 0,1 [31:0] for bit address BIT [0]=0 and BIT [0]=1, respectively. A byte of input data RED_DATA_IN [7:0] is fed in parallel from the 8-bit serial input register SI_REG [7:0] 42 through the 8-bit bus 44 to input terminals of the data_in replacement logic block 22. The column redundancy match logic block 26 provides match signals MATCH_0,1 [3:0] on a matching signal bus 48 to the data_in replacement logic block 22. Based on the match signals, the data in replacement logic block 22 replaces data bits from defective memory locations with dummy 1 bits. An output bus 50 of the data_in replacement logic block 22 couples normal data bytes to the FIFO register 32, which stores 28 bytes of memory data. At an appropriate time after a page of memory data is received, output bytes FIFO_OUT [7:0] from the FIFO 32 are coupled to the databus multiplexer DBUS MUX 52 on an output bus 54. Output bytes DBUS [7:0] from the DBUS MUX 52 are coupled on a bus 56 to the input terminals of the FLASH memory 12.

For a read mode of operation, a byte of output data ADIO [7:0] is provided in parallel from the FLASH memory 12 on a bus 60 to an 8-bit serial output register SO_REG [7:0] 62. Redundant data bits are also loaded from the bus 60 into the 32-bit redundancy data register 30. A serial output terminal of the SO_REG [7:0] 62 is connected through a signal line 64 to an input terminal of an output multiplexer OUT_MUX 66. The column redundancy match logic block 26 provides two groups of match signals MATCH_0,1 [3:0] on a matching signal bus 70 to the data_out replacement logic block 24. Redundant output data from the 32-bit redundancy data register RED_OUT_DATA REG [31:0] 30 are provided on a bus 72 to the data_out replacement logic block 24. A data_out_0 signal on a line 74 and a data_out_1 signal on a line 76 are provided from the data_out replacement logic block 24 to the output multiplexer OUT_MUX 66. An output terminal of the output multiplexer OUT_MUX 66 is connected to the output terminal 78 for a serial output signal SO.

Figure 2:
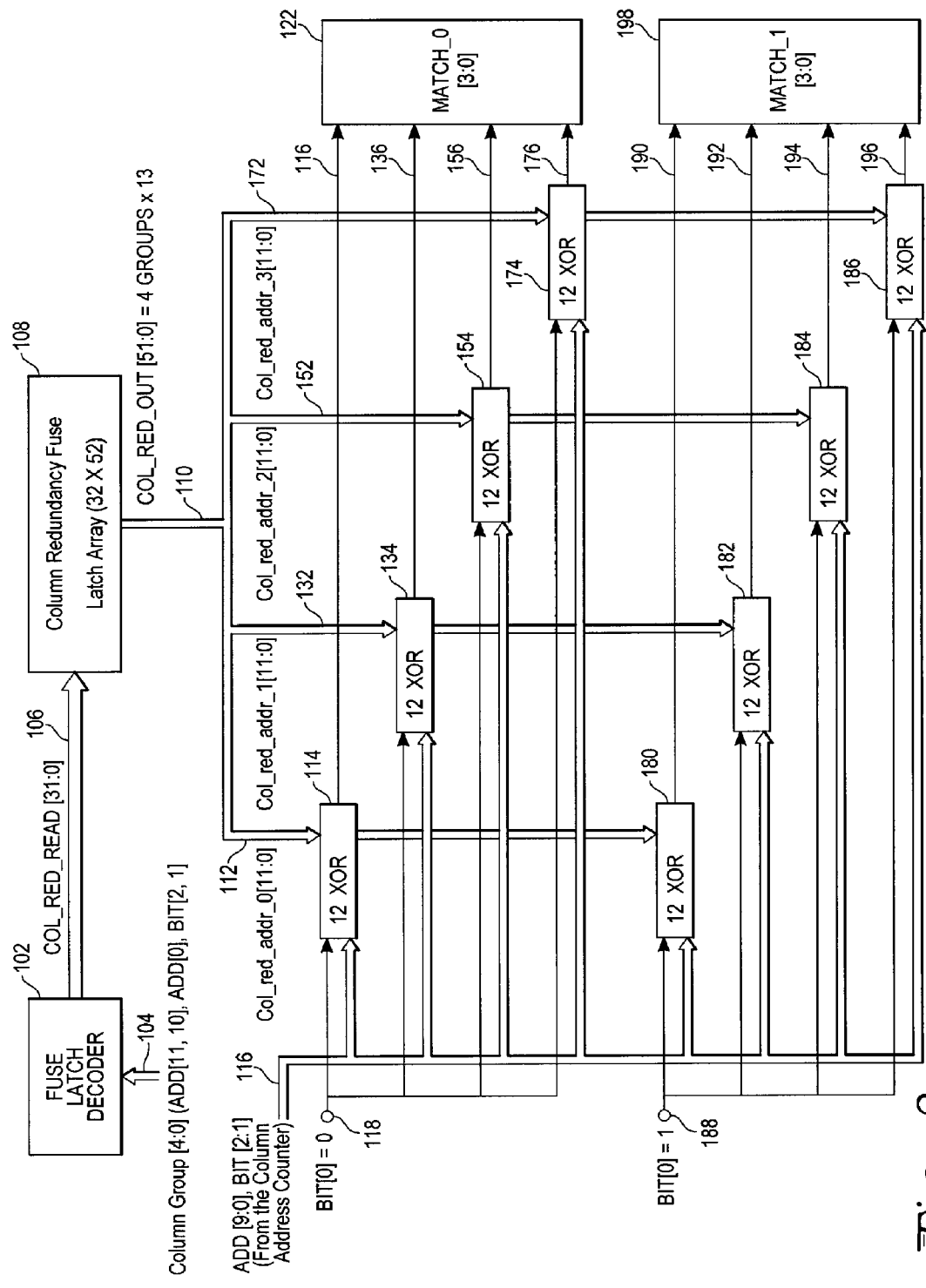
FIG. 2 is a block diagram of an embodiment of column redundancy match logic.

FIG. 2 shows an embodiment of the column redundancy match logic block 26 of FIG. 1. Five-bit addresses [4:0] to decode thirty-two redundancy column groups are provided on an input bus 104 to a fuse latch decoder 102 as ADD [11,10], ADD [0], and BIT [2,1]. For each of the thirty-two column group addresses, the fuse latch decoder 102 provides one of thirty-two column redundancy read signals COL_RED_READ [31:0] on a bus 106 to a column redundancy fuse latch array (32×52) 108, in which are stored the 32 rows, each of 4 groups of 13-bit addresses identifying defective cells in the FLASH memory.

For one of the 32 rows of the column redundancy fuse latch array 108, selected by one of the 32 column redundancy read signals COL_RED_READ [31:0], an output bus 110 provides the stored redundant column addresses COL_RED_OUT [51:0] for four GROUPS [0:3] of 13-bit redundant column addresses.

For GROUP 0, a branch bus 112 provides address bits Col_red_addr_0 [11:0] to a 12-bit Exclusive-Or XOR circuit 114. Input addresses ADD [9:0], BIT [2:1] for each page are provided from a column address counter on a bus 116 to corresponding input terminals of the 12-bit Exclusive-Or XOR circuit 114. One of the 4-bit nibbles of an 8-bit data byte is addressed by BIT [0]=0 at terminal 118 to enable the 12-bit Exclusive-Or XOR circuit 114. If a corresponding match occurs, the 12-bit Exclusive-Or XOR circuit 114 provides a MATCH_0 [3] signal on a signal line 116 to the MATCH_0 [3:0] circuit 122.

For GROUP1, a branch bus 132 provides address bits Col_red_addr_1 [11:0] to a 12-bit Exclusive-Or XOR circuit 134. The input addresses ADD [9:0], BIT [2:1] on the bus 116 are also provided to corresponding input terminals of the 12-bit Exclusive-Or XOR circuit 134. One of the 4-bit nibbles of an 8-bit data byte is addressed by BIT [0]=0 at terminal 118 to also enable the 12-bit Exclusive-Or XOR circuit 134. If a corresponding match occurs, the 12-bit Exclusive-Or XOR circuit 134 provides a MATCH_0 [2] signal on a signal line 136 to the MATCH_0 [3:0] circuit 122.

For GROUP2, a branch bus 152 provides address bits Col_red_addr_2 [11:0] to a 12-bit Exclusive-Or XOR circuit 154. The input addresses ADD [9:0], BIT [2:1] on the bus 116 are also provided to corresponding input terminals of the 12-bit Exclusive-Or XOR circuit 154. One of the 4-bit nibbles of an 8-bit data byte is addressed by BIT [0]=0 at terminal 118 to also enable the 12-bit Exclusive-Or XOR circuit 154. If a corresponding match occurs, the 12-bit Exclusive-Or XOR circuit 154 provides a MATCH_0 [1] signal on a signal line 156 to the MATCH_0 [3:0] circuit 122.

For GROUP 3, a branch bus 172 provides address bits Col_red_addr_3 [11:0] to a 12-bit Exclusive-Or XOR circuit 174. The input addresses ADD [9:0], BIT [2:1] on the bus 116 are also provided to corresponding input terminals of the 12-bit Exclusive-Or XOR circuit 174. One of the 4-bit nibbles of an 8-bit data byte is addressed by BIT [0]=0 at terminal 118 to also enable the 12-bit Exclusive-Or XOR circuit 174. If a corresponding match occurs, the 12-bit Exclusive-Or XOR circuit 174 provides a MATCH_0 [0] signal on a signal line 176 to the MATCH_0 [3:0] circuit 122.

In a similar manner, the branch busses 112, 132, 152, 172 respectively provide the Col_red_addr_0 [11:0] address bits to a 12-bit Exclusive-Or XOR circuit 180, the Col_red_addr_1 [11:0] address bits to a 12-bit Exclusive-Or XOR circuit 182, the Col_red_addr_2 address bits [11:0] to a 12-bit Exclusive-Or XOR circuit 184, and the Col_red_addr_3 address bits [11:0] to a 12-bit Exclusive-Or XOR circuit 186. All of the Exclusive-Or XOR circuits 180, 182, 184, 186 have a second 4-bit nibble of an 8-bit data byte addressed by BIT [0]=1 at a terminal 188. All of the Exclusive-Or XOR circuits 180, 182, 184, 186 receive the input addresses ADD [9:0], BIT [2:1] for each page from the column address counter on the bus 116. If corresponding matches occur in the Exclusive-Or XOR circuits 180, 182, 184, 186, a corresponding MATCH_1 [3] signal is provided on a signal line 190 to a MATCH_1 [3:0] circuit 198; a corresponding MATCH_1 [2] signal is provided on a signal line 192 to the MATCH_1 [3:0] circuit 198; a corresponding MATCH_1 [1] signal is provided on a signal line 194 to the MATCH_1 [3:0] circuit 198; and a corresponding MATCH_1 [0] signal is provided on a signal line 196 to the MATCH_1 [3:0] circuit 198. In summary, the column redundancy match logic generates two groups of match signals MATCH_0 [3:0] and MATCH_1 [3:0], for bit address BIT [0]=0 and BIT [0]=1, respectively.

The arrangement of FIG. 2 provides certain data replacement protocols. Specific numeric examples are provided here for purposes of illustration; other numeric values can be used as required. The FLASH memory 12 of FIG. 1 is provided with 128×13 Column Fuse address registers, which are fused to address the 128 redundant columns with 13-bit addresses.

There are 64×13 Column Fuse registers for each memory plane. Within each of the two planes in an array, addressed by address bit BYTE_ADD [10], there are two pages each containing 32×13 Column Fuse registers. Each of the two pages is addressed by address bit BYTE_ADD [11]. One Column Fuse register contains 1 Flag bit plus 12 address bits, with the address bits provided by BYTE_ADD [9:1] and BIT_ADD [2:0]. The address space in one page, BYTE_ADD [9:0], BIT_ADD [2:0] is split into 8 Column Groups, using address bits BYTE_ADD [0] and BIT_ADD [2:1]. Therefore there are 32 groups for the whole array, selected by addressing bits BYTE_ADD [10:11].

In order to reduce redundancy logic in this particular embodiment, a limitation in the replacement architecture is that only 4 redundant columns are used to replace faulty bits for each of the 32 column groups. Other embodiments may have other limitations. The column group address is used to read the Column Fuse Latch Array, four Redundant Addresses at a time. In some situations, it is not allowed to have MATCH 0 and MATCH 1 be generated for the same address and Column Group.

In the allotted redundancy replacement period, the redundant data processing is accomplished in such a way so as to comply with the requirement for the following data order:
Byte 0, bits 7,6,5,4,3,2,1,0
Byte 1, bits 7,6,5,4,3,2,1,0
.
.
Byte 527, bits 7,6,5,4,3,2,1,0

According to this, the order of Column Group processing is: 3, 2, 1, 0, 7, 6, 5, 4 as in the Table:

| | Column Group | | | | | | | |
|---|---|---|---|---|---|---|---|---|
| | 3 | 2 | 1 | 0 | 7 | 6 | 5 | 4 |
| BIT | 7, 6 | 5, 4 | 3, 2 | 1, 0 | 7, 6 | 5, 4 | 3, 2 | 1, 0 |
| BYTE[0] | 0 | 0 | 0 | 0 | 1 | 1 | 1 | 1 |

Redundant data processing is generally completed two bits at a time in a program mode for incoming data processing and in a read mode for outgoing data replacement. For a page size of 512 bytes or 528 bytes, the FIFO register 32 of FIG. 1 has capacity of 28 bytes such that, at any given time, one byte holds the presently processing byte and twenty-seven bytes are used to ensure memory data is in phase.

Summary of Column Redundancy Replacement During Various Operation Modes

The following sections describe the sequence of events during each of three operational modes initiated by the user, namely: page program, page read, and block erase. The following also describes how the redundancy logic processes a data stream.

Figure 3:
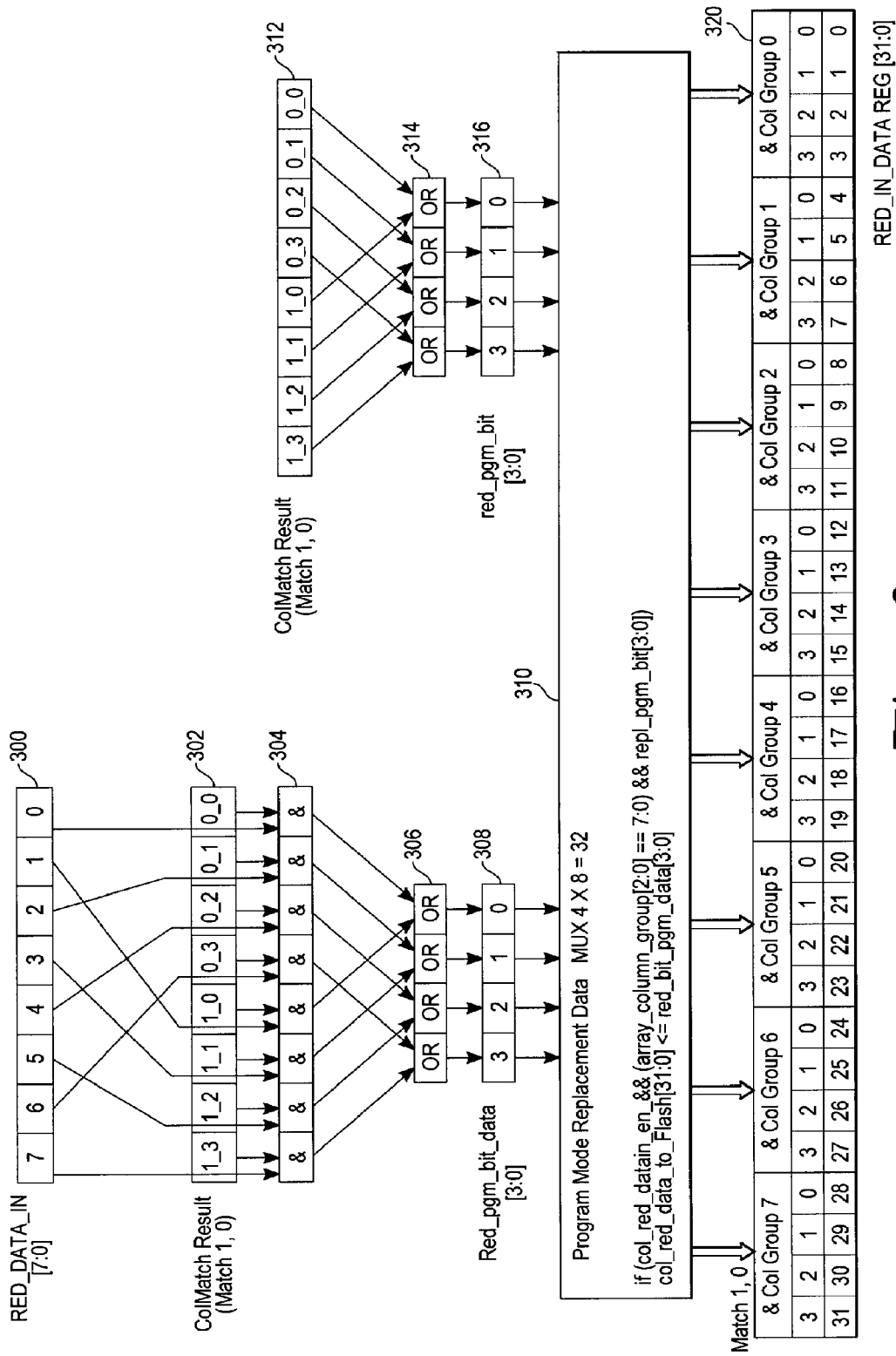
FIG. 3 is a block diagram of an embodiment of column redundancy program replacement logic.

Page Program: FIG. 3 illustrates column redundancy replacement logic for programming the FLASH memory. An input shift register block 300 has redundant data shifted into it. A column match result block 302 contains the matching results signals for the MATCH_0 [3:0] and MATCH_$_1$ [3:0] functions. Each of the MATCH_0 [3:0] and MATCH_$_1$ [3:0] signals that are active are logically combined in respective AND function blocks 304 to provide either first nibble signals or second nibble signals to the OR block 306. The outputs of the OR block 306 provide up to four replacement program data bits [3:0] to the register block 308. Four output signals from the register block 308 are provided as one set of inputs to a PROGRAM NODE REPLACEMENT DATA MUX 310.

A column match logic block 312 provides column match output signals for one set of Column MATCH_1 or column MATCH_0 signals. The column match logic block 312 sends 4 bits from either the register 308 or the register 316 to one of eight column groups [7:0]. For each nibble the logic for the PROGRAM NODE REPLACEMENT DAT MUX 310 provides column redundant data to one of either column groups COL Group [7:0] 320 if a column redundant data in enable signal (col_red_datain_en) is active, if one of the 32 array column groups is active, and if a replacement program bit repl_pgm_bit [3:0] is active.

The relevant sequence of events that take place during a page program mode of operation is described as follows: With reference to FIGS. 1, 2, 3, and 4, a user issues a page program command and the user sends in a main page address for a page. The user's main page address gets latched into a page address register, while a column address is provided by an internal column address counter that always starts from 0. The user starts an external serial clock signal SCK at, for example, a 66 Mhz clock rate and sends in bit-wise data to the serial input SI terminal 40 of FIG. 1.

Figure 4:
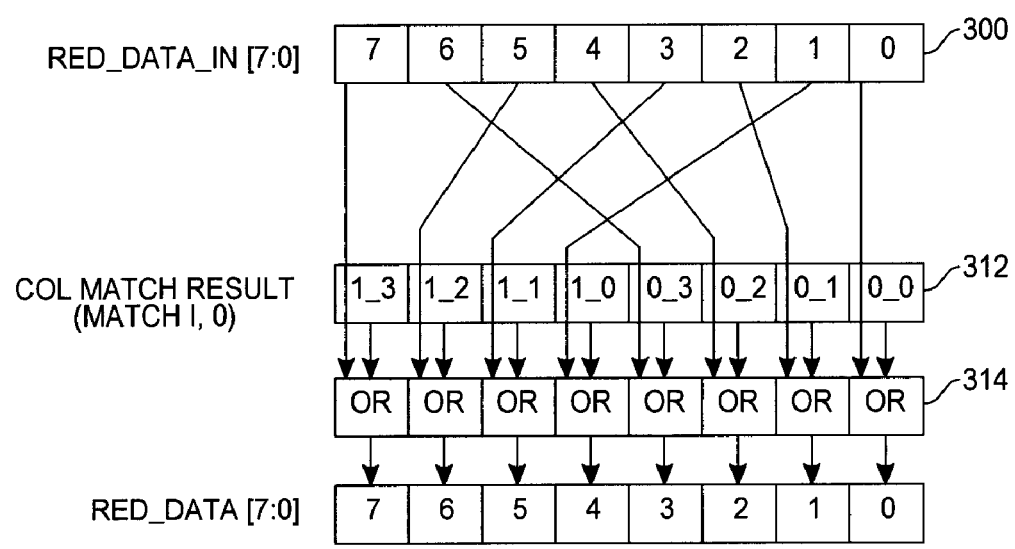
FIG. 4 is a block diagram of an embodiment of column redundancy program mask data logic.

FIG. 4 illustrates column redundancy program mask data logic for the FIFO 32 in accordance with an embodiment.

This bit-wise serial input data is serially shifted into the 8-bit input shift register 42. From an 8-bit output of the 8-bit shift register 42 data is shifted in parallel to the data_in replacement logic block 22 for processing. Replacement data is processed every two bits. Therefore, the frequency of the redundancy clock is half the rate of the external serial clock signal SCK.

The data_in replacement logic block 22 does the following: For every redundancy clock signal, or for two serial clock SCK signals, the data_in replacement logic block 22 increments the column address counter. The various EXCLUSIVE-OR blocks and the related logic detect if there is a match between an input address and an address for a defective memory cell. There may be two matching addresses at a time, one for BIT [0]=0 and one for BIT [0]=1.

For the same redundancy clock signal, if a match is not found between an input address and an address for a defective memory cell, the latest two input bits are sent unprocessed into the 8-bit DBUS MUX 52 and the FIFO 32. If, on the other hand, a match is found, the data bits are masked (set to 1) and sent to the same data output. The original data bits for a defective memory cell are stored in a 32-bit redundancy data register 28 that is sized to hold the redundancy data for a single page. For every 4 replacement steps covering 8 bits, or a full byte, the data_in replacement logic block 22 sends a processed input data byte (masked or not masked) to the FIFO and shifts the FIFO data.

After filling the FIFO 32 with 28 bytes, the FIFO 32 output data is sent to the DBUS MUX 52 and from there to the Flash Memory 12. In case of partial page programming that is less than 28 bytes, the system will start sending the FIFO output data at an appropriate time. When the user sends in the last byte of information at the last external clock, the circuit will keep on running on an internal clock until the rest of the FIFO bytes are flushed out to the Flash memory 12.

After completion of sending of input data to the Flash memory, the redundant data from the 32-bit redundancy data register RED_IN DATA REG [31:0] 28 is in turn sent to the Flash memory. This is done in 8 internal clock cycles, 4 redundant bits and four dummy bits at a time. Once all of the column redundancy data has been sent into the FLASH memory, internal Flash page programming starts within the FLASH memory 12.

Page Read: The relevant sequence of events that take place during a page read are described below in connection with FIGS. 1 and 2. A user issues a page read command and sends serially in the main address for a page. The user's page address gets latched into the address register, while the column address is defined by the internal column address counter that in an embodiment starts from 0.

If an internal read latency time, for example, of 10 microseconds is specified, the following steps are performed in that latency time. An internal CLK is turned on that facilitates the following sequence of events: An internal read algorithm is executed, which involves sending in a correct block address, followed by a sequence of micro controller commands that executes an internal page read. Once the internal page read is complete, 32 bits of redundancy data for a single plane being addressed are read out and stored in the 32-bit redundancy data_out register 30. The companion chip then issues a command to clock out regular data for one byte on DBUS [7:0] 60 per internal CLK cycle.

Referring to FIG. 1, upon receipt of each byte, the data_out replacement logic block 24 performs the opposite of the data_in replacement logic block 22 as follows: At every 8 SCK for one byte of data, four redundancy clocks occurs such that the redundancy data register 30 receives a data byte from the Flash memory 12 and latches it into the Output Shift Register 62. At every redundancy clock, or two system clocks SCK, the column address is incremented. If a match is found, the system gets from the 32 bit data register 30 up to two bits of redundant data, corresponding to Bit (0)=0 and Bit (0)=1 and passes them to the output mux 66. The serial data from the Shift Register 62 is then muxed with the redundant data for every SCK and sent to the SO output terminal 78. If a match is not found, the serial data is sent unprocessed to the SO output terminal 58.

Block Erase: Both the program data-in and erase-verify data-in modes of operation are very similar with the exception that during the erase-verify mode of operation the user does not send any external data into the device. Therefore, the column redundancy is handled in a similar fashion to the program data-in mode of operation. The relevant sequence of events that take place during a block erase is described below: The user issues a block erase command and sends in the main address serially. The user address gets latched into the address register, while the column address is defined by the internal column address counter that always starts at 0. If an internal erase latency time, for example, of 2 ms is specified, the following steps must be performed in that latency time.

Referring to FIG. 1, an internal CLK is turned on that facilitates the following sequence of events: A data stream of all zeros (512/528 bytes) is sent into the data_in replacement logic block 22. The redundancy data-in processing unit 22 latches each byte of zeros in parallel. An internal state machine of the data_in replacement logic block 22 goes through 4 states in which 2 bits of redundancy are processed every TNT CLK cycle. Match bits from the column redundancy match logic block 26 are sent into the data_in replacement logic block 22. If a match is not found, the zero bit is sent unprocessed into the 8-bit output data mux DBUS MUX 52 1 FF (data_out_red_ers). If on the other hand, a match is found, then the zero bit is stored in 32-bit redundancy data register RED_IN DATA REG [31:0] 28. The bit is then masked (set to 1) and sent into the 8-bit DBUS MUX 52.

A byte of data is sent with a DCLK through the DBUS MUX 52 onto DBUS [7:0] 56 every 4 INT_CLK cycles, where DCLK=INT_CLK/4). This procedure is repeated until all 512 or 528 bytes of zeros have been processed by the redundancy logic and sent into the Flash memory chip 12. This data is used to preset the memory chip page registers for a correct erase verify operation. The last step is to send the 32-bit redundancy information into the FLASH memory chip 12 through the DBUS (ADM) lines, again using the internal clock. Once all of the column redundancy data has been sent into the memory chip, an internal block erase can begin.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the Claims appended hereto and their equivalents.

What is claimed is:

1. A system comprising:
    an input data replacement logic block through which input data is masked or optionally modified;
    an output data replacement logic block in which memory data from a defective memory cell is replaced with correct redundancy data;
    a column redundancy match logic block that compares an address to a latched address of a defective column and that provides corresponding match signals to the input data and output data replacement logic blocks to facilitate replacement of bits from defective memory cells with replacement redundancy bits;
    a redundant input data register configured to store redundant input data information; and
    a multiplexer including a first input to receive data from the input data replacement logic, a second input to receive data from the redundant input data register, and an output coupled to a non-volatile memory.

2. The system of claim 1 including, a FIFO register configured to mask internal operations of a memory controller logic while data is sent to the non-volatile memory.

3. The system of claim 1 including, for a read mode of operation, a multi-bit data read redundancy register configured to store redundant output information such that, if a match is found, serial data from the non-volatile memory output shift register is dynamically replaced with redundant data before being sent to the output data terminal; and, if a match is not found, the serial data is sent unmodified from the output shift register to an output data terminal.

4. The system of claim 1 including:
    an address register into which is latched a main address for a memory page of the non-volatile memory; and
    a column address counter that provides column addresses for the memory page.

5. The system of claim 1 wherein the column redundancy match logic block includes circuits that compare input address bits for input data bytes to respective address bits for defective memory cells and that provide the match signals.

6. The system of claim 5 wherein the latched address of a bad column is stored in a column redundancy latch circuit that receives column redundancy addresses from a circuit in the non-volatile memory circuit.

7. The system of claim 1 wherein program data is provided as bytes and wherein memory data are processed as sub-bytes.

8. The system of claim 1 wherein read data are provided as bytes and wherein memory data are processed as sub-bytes.

9. A system comprising:
a non-volatile memory that stores memory data and redundancy column data for defective memory cells;
column redundancy match logic that compares a memory address against those of defective non-volatile memory cells and that provides a corresponding match signal, when an address match is identified;
input data replacement logic that, in response to a match signal, is configured to store input data destined for defective non-volatile memory cells in a redundant input data register and that is configured to send input data to a register for masking operations of the column redundancy match logic and the input data replacement logic; and
a multiplexer including a first input to receive data from the input data replacement logic, a second input to receive data from the redundant input data register, and an output coupled to the non-volatile memory.

10. The system of claim 9 including the non-volatile memory that is configured to store FIFO register output data in corresponding non-volatile memory cells and that is configured to store the collective contents of the redundant input data register in corresponding redundant columns of the non-volatile memory.

11. The system of claim 9 including:
an address register into which is latched a main address for a memory page of the non-volatile memory; and
a column address counter that provides column addresses for the memory page.

12. The system of claim 11 wherein the latched address of a bad column is stored in a column redundancy latch circuit that receives column redundancy addresses from a circuit in the non-volatile memory circuit.

13. The system of claim 9 wherein the column redundancy match logic block includes circuits that compare input address bits for input data bytes to respective address bits for defective memory cells and that provide the match signals.

14. The system of claim 9 wherein program data and read data are provided as bytes and wherein memory data is processed as sub-bytes.

15. A system comprising:
a non-volatile memory that stores memory data and redundant column data for defective memory cells;
column redundancy match logic that compares a read memory address against those of defective non-volatile memory cell and that provides a corresponding match signal when an address match is identified;
an output data redundancy register which is configured to store redundant column data transferred from the non-volatile memory;
an output shift register into which is latched a byte of data from the non-volatile memory corresponding to a memory address; and
a multiplexer including a first input to receive data from the output data redundancy register, a second input to receive data from the output shift register, and an output coupled to an output terminal.

16. The system of claim 15 including:
if an address match is not found, the data is sent unmodified from the output shift register to the serial output data terminal; and
if an address match is found, serial data from the shift register is replaced with redundant data from the redundancy register and sent to the serial output data terminal to provide dynamic replacement of data from defective non-volatile memory cells.

17. The system of claim 15 including:
an address register into which is latched a main address for a memory page of the non-volatile memory; and
a column address counter that provides column addresses for the memory page.

18. The system of claim 15 wherein the column redundancy match logic block includes circuits that compare input address bits for input data bytes to respective address bits for defective memory cells and that provide the match signals.

19. The system of claim 18 wherein the latched address of a bad column is stored in a column redundancy latch circuit that receives column redundancy addresses from a circuit in the non-volatile memory circuit.

20. The system of claim 18, wherein program data and read data are provided as bytes and wherein memory data is processed as sub-bytes.

21. A method comprising:
masking and modifying data in an input data replacement logic block through which serial input data is masked, and optionally modified, and sent to a non-volatile memory;
replacing memory data from a defective memory cell with correct redundancy data in an output data replacement logic block;
providing data from the non-volatile memory to an output shift register; and
providing data from the output shift register to a first input of a multiplexer;
providing data from the output data replacement logic block to a second input of the multiplexer;
sending data with correct replacement bits from an output of the multiplexer to an output terminal; and
comparing an address to a latched addresses of bad columns in a column redundancy match logic block and providing match signals to the input data and output data replacement logic blocks to facilitate replacement of bits from defective memory cells with correct redundancy data bits.

22. The method of claim 21 including, for a program mode of operation, storing in a multi-bit redundancy data program register the redundant input data information and masking with a register the internal operations of a memory controller logic while data is serially sent to the non-volatile memory.

23. The method of claim 21 including, for a read mode of operation, storing in a multi-bit redundancy data read register redundant output information such that if an address match is not found, the data is sent unmodified from an output shift register to the serial output data terminal; and
such that, if a match is found identifying a defective memory cell, data from the shift register is replaced with the corresponding redundant data bits and sent to the output data terminal to provide dynamic replacement of data bits from defective non-volatile memory cells.

24. The method of claim 21 including;
latching in an address register a main address for a memory page of the non-volatile memory; and
providing column addresses for the memory page with a column address counter.

25. The method of claim 21 including comparing input address bits for input data bytes to respective address bits for defective memory cells and providing match signals.

* * * * *

UNITED STATES PATENT AND TRADEMARK OFFICE
CERTIFICATE OF CORRECTION

PATENT NO. : 8,190,950 B2  
APPLICATION NO. : 11/963245  
DATED : May 29, 2012  
INVENTOR(S) : Alan Chen et al.

Page 1 of 1

It is certified that error appears in the above-identified patent and that said Letters Patent is hereby corrected as shown below:

In the Specifications

Column 2, Line 44: delete "is comprises" and insert --comprises--.

Column 5, Line 59: delete "MATCH_$_1$" and insert --MATCH_1--.

Column 5, Line 60: delete "MATCH_$_1$" and insert --MATCH_1--.

Column 6, Line 62: delete "RED_IN DATA" and insert --RED_IN_DATA--.

Column 7, Line 61: delete "RED_IN DATA" and insert --RED_IN_DATA--.

Signed and Sealed this  
Seventh Day of January, 2014

Margaret A. Focarino  
*Commissioner for Patents of the United States Patent and Trademark Office*